(12) United States Patent
Kiba

(10) Patent No.: US 9,812,495 B2
(45) Date of Patent: Nov. 7, 2017

(54) LIGHT EMITTING DEVICE AND LIGHTING APPARATUS

(71) Applicant: PANASONIC INTELLECTUAL PROPERTY MANAGEMENT CO., LTD., Osaka (JP)

(72) Inventor: Keiji Kiba, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/452,008

(22) Filed: Mar. 7, 2017

(65) Prior Publication Data

US 2017/0263673 A1 Sep. 14, 2017

(30) Foreign Application Priority Data

Mar. 8, 2016 (JP) .................. 2016-045012

(51) Int. Cl.
| | |
|---|---|
| *H01L 33/10* | (2010.01) |
| *H01L 33/20* | (2010.01) |
| *H01L 33/60* | (2010.01) |
| *H01L 27/15* | (2006.01) |
| *H01L 33/52* | (2010.01) |
| *H01L 33/50* | (2010.01) |

(52) U.S. Cl.
CPC .......... *H01L 27/156* (2013.01); *H01L 33/507* (2013.01); *H01L 33/52* (2013.01); *H01L 33/60* (2013.01); *H01L 33/10* (2013.01); *H01L 33/20* (2013.01)

(58) Field of Classification Search
CPC ....... H01L 27/156; H01L 33/10; H01L 33/20; H01L 33/60
USPC ....................................... 257/88, 98
See application file for complete search history.

(56) References Cited

U.S. PATENT DOCUMENTS

| | | | | |
|---|---|---|---|---|
| 6,504,180 | B1* | 1/2003 | Heremans | G02B 6/4249 257/88 |
| 6,613,461 | B1* | 9/2003 | Sugahara | C30B 29/406 117/952 |
| 6,946,687 | B2* | 9/2005 | Eisert | H01L 33/08 257/103 |
| 2002/0030201 | A1* | 3/2002 | Uemura | H01L 33/20 257/189 |
| 2003/0122478 | A1* | 7/2003 | Suehiro | H01L 33/08 313/498 |
| 2005/0281303 | A1* | 12/2005 | Horio | H01L 33/08 372/44.01 |
| 2007/0176188 | A1* | 8/2007 | Tanaka | H01L 33/46 257/88 |

(Continued)

FOREIGN PATENT DOCUMENTS

| | | |
|---|---|---|
| JP | 4-77270 U | 7/1992 |
| JP | 2008-84943 | 4/2008 |

(Continued)

*Primary Examiner* — George Fourson, III
(74) *Attorney, Agent, or Firm* — Greenblum & Bernstein, P.L.C.

(57) ABSTRACT

A light emitting device is provided. The light emitting device includes a substrate and a plurality of light emitting elements disposed on a major surface of the substrate. The substrate includes a reflector recessed in the major surface and surrounding at least a portion of the plurality of light emitting elements.

19 Claims, 10 Drawing Sheets

(56) References Cited

U.S. PATENT DOCUMENTS

| | | | |
|---|---|---|---|
| 2008/0131987 A1* | 6/2008 | Horino | H01L 33/08 438/43 |
| 2010/0022039 A1* | 1/2010 | Chang | H01L 33/0095 438/28 |
| 2010/0123146 A1* | 5/2010 | Lin | H01L 33/20 257/91 |
| 2011/0084299 A1 | 4/2011 | Kotani et al. | |
| 2011/0104835 A1* | 5/2011 | Nihei | H01L 33/0079 438/28 |
| 2011/0221333 A1* | 9/2011 | Kim | H01L 51/524 313/504 |
| 2013/0003204 A1* | 1/2013 | Cheng | H01L 31/02363 359/850 |
| 2014/0034994 A1* | 2/2014 | Yamane | H01L 51/5253 257/99 |
| 2017/0012408 A1* | 1/2017 | Hashimoto | H01S 5/125 |

FOREIGN PATENT DOCUMENTS

| | | |
|---|---|---|
| JP | 2011-86678 | 4/2011 |
| JP | 2011-222628 | 11/2011 |
| JP | 2012-209377 | 10/2012 |

* cited by examiner

LIGHT EMITTING DEVICE AND LIGHTING APPARATUS

CROSS REFERENCE TO RELATED APPLICATION

This application claims the benefit of priority of Japanese Patent Application Number 2016-045012 filed on Mar. 8, 2016, the entire content of which is hereby incorporated by reference.

BACKGROUND

1. Technical Field

The present disclosure relates to a light emitting device including a substrate and a plurality of light emitting elements disposed on the substrate, and to a lighting apparatus including the light emitting device.

2. Description of the Related Art

Semiconductor light emitting elements such as light emitting diodes (LEDs) are widely used as highly efficient, space saving light sources in a variety of light emitting devices including those used in lighting apparatuses or displays.

For example, Japanese Unexamined Patent Application Publication No. 2011-222628 discloses a liquid crystal display backlight module configured of a plurality of connected LED packages. In the LED packages, edges of a metal board on which a plurality of sealed LEDs are disposed are bent to form a reflector, and a light transmissive resin fills the region inside the reflector. Additionally, adjacent LED packages are electrically and mechanically connected by a depressed and protruding section of the back surface of the reflector.

SUMMARY

When light emitting elements such as LEDs are discretely disposed on a substrate, as is the case with the above conventional LED package, the light source on the substrate is made up of a plurality of discrete points, which results in an apparent unevenness in color and/or luminance.

The present disclosure has been conceived in light of the above problem with the conventional technique, and has an object to provide a light emitting device that includes a plurality of light emitting elements disposed on a substrate and reduces unevenness in color and/or luminance, and a lighting apparatus including the light emitting device.

According to one aspect of the present disclosure, a light emitting device includes a substrate and a plurality of light emitting elements disposed on a major surface of the substrate. The substrate includes a reflector recessed in the major surface and surrounding at least a portion of the plurality of light emitting elements.

According to one aspect of the present disclosure, a lighting apparatus includes the above-described light emitting device.

Accordingly, the present disclosure provides a light emitting device that reduces unevenness in color and/or luminance and a lighting apparatus including the light emitting device.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Figure 1:
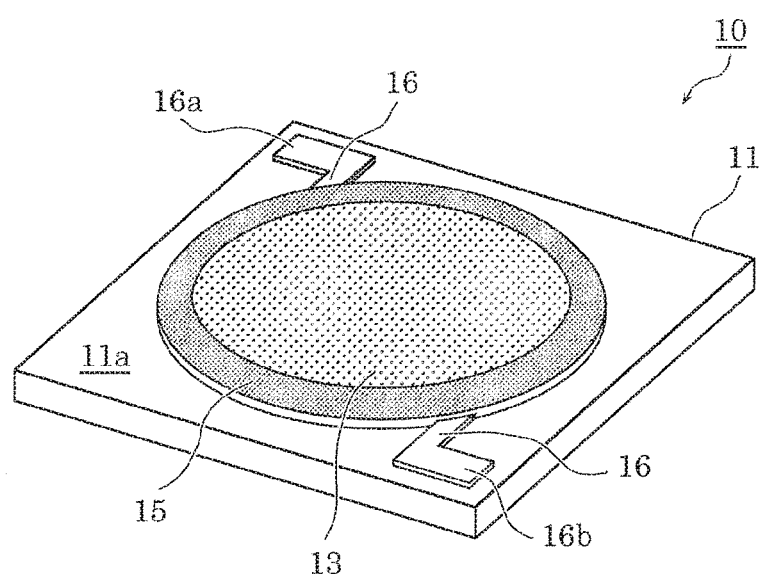
FIG. 1 is an external perspective view of the light emitting device according to Embodiment 1.

The following describes embodiments and embodiment variations of a light emitting device with reference to the drawings. Note that the embodiments described below each show a specific example. The numerical values, shapes, materials, elements, the arrangement and connection of the elements, steps, and order of the steps etc., indicated in the following embodiments are mere examples, and therefore do not intend to limit the inventive concept. Therefore, among the elements in the following embodiments, those not recited in any of the independent claims defining the most generic part of the inventive concept are described as optional elements.

Note that the drawings are schematic diagrams and are not necessarily precise illustrations. Moreover, in the drawings, elements having essentially the same configuration share like reference numerals. Therefore, overlapping descriptions thereof are omitted or abridged Embodiment 1

(Configuration of Light Emitting Device)

Figure 2:
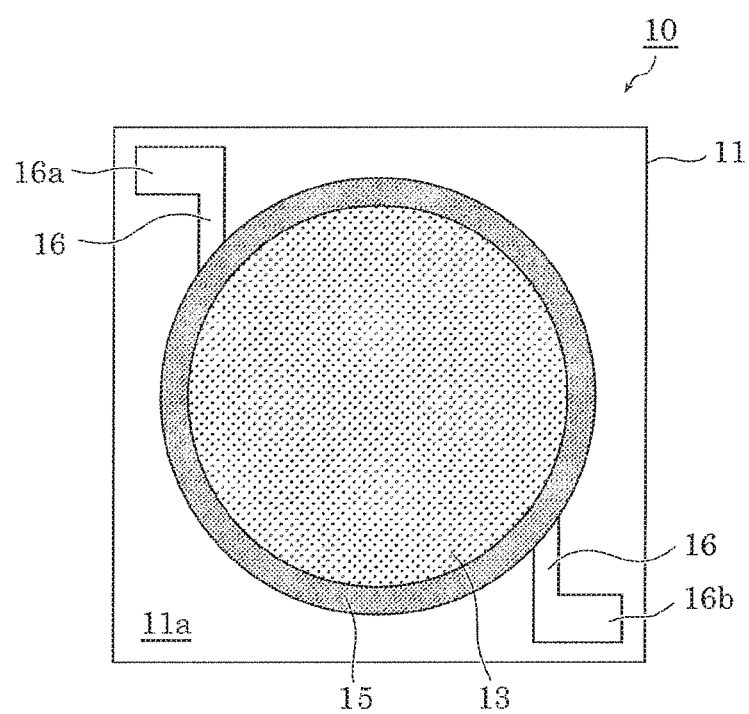
FIG. 2 is a plan view of the light emitting device according to Embodiment 1.
Figure 3:
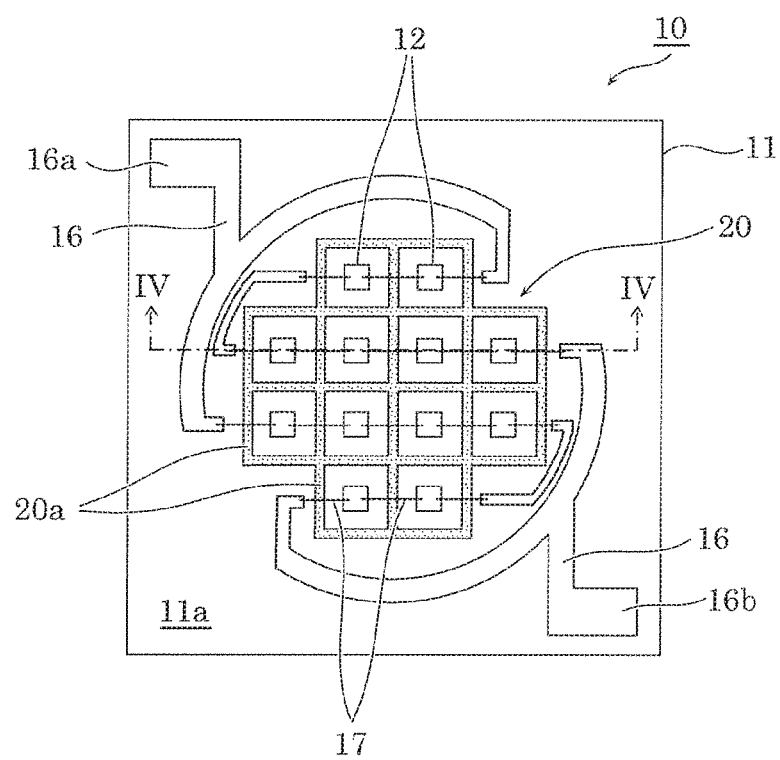
FIG. 3 is a plan view illustrating the structure of the light emitting device according to Embodiment 1.

First, the configuration of the light emitting device according to Embodiment 1 will be described with reference to FIG. 1 through FIG. 4B. FIG. 1 is an external perspective view of light emitting device 10 according to Embodiment 1. FIG. 2 is a plan view of light emitting device 10 according to Embodiment 1. FIG. 3 is a plan view illustrating the structure of light emitting device 10 according to Embodiment 1. Note that in order to illustrate the array of LED chips 12 and the line pattern for LED chips 12 in FIG. 3, sealant layer 13 and dam 15 illustrated in FIG. 2 are omitted from FIG. 3.

Figure 4A:
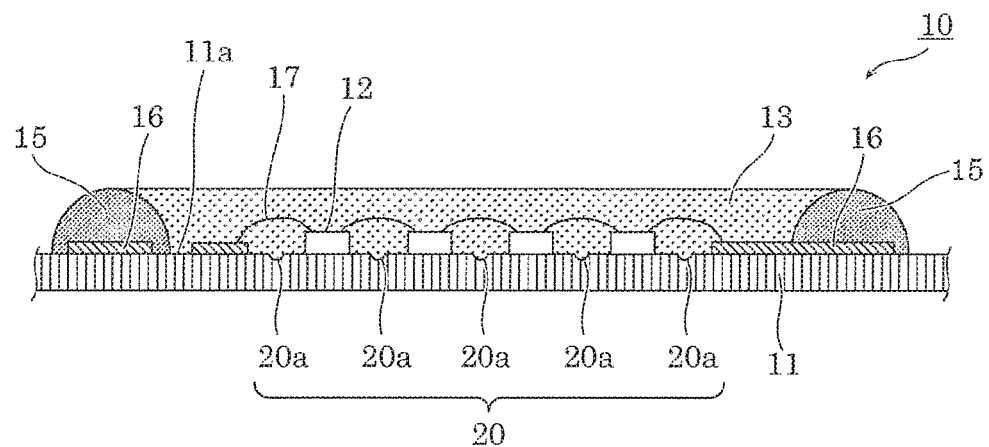
FIG. 4A is a diagrammatic cross sectional view taken along line IV-IV in FIG. 3.
Figure 4B:
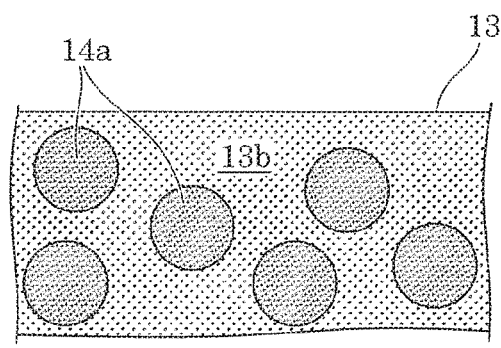
FIG. 4B schematically illustrates the configuration of the sealant layer according to Embodiment 1.

FIG. 4A is a diagrammatic cross sectional view taken along line IV-IV in FIG. 3, and FIG. 4B schematically illustrates the configuration of sealant layer 13 according to Embodiment 1.

As illustrated in FIG. 1 through FIG. 4A, light emitting device 10 according to Embodiment 1 includes substrate 11 and LED chips 12 disposed on major surface 11a of substrate 11. In this embodiment, light emitting device 10 further includes sealant layer 13 and dam 15.

Light emitting device 10 is a LED module having a chip on board (COB) structure in which LED chips 12 are directly mounted on substrate 11.

Substrate 11 is a printed circuit board on which lines 16 and electrodes 16a and 16b are patterned. Examples of substrate 11 include a ceramic substrate, resin substrate, and metal based substrate.

Examples of a ceramic substrate include an alumina substrate made from aluminum oxide (alumina) and an aluminum nitride substrate made from aluminum nitride. Examples of a metal based substrate include an aluminum alloy substrate, an iron alloy substrate, and a copper alloy substrate whose surfaces are covered with an electrically insulating film. Examples of a resin substrate include a glass epoxy substrate made from fiberglass and epoxy resin, for example. Note that in Embodiment 1, substrate 11 is rectangular, but substrate 11 may be circular or some other shape.

Substrate 11 according to this embodiment includes reflector 20 recessed in major surface 11a and surrounding each of LED chips 12. In this embodiment, reflector 20 includes a plurality of grooves 20a. Note that in FIG. 3, to make it easier to differentiate between reflector 20 and other components on substrate 11, the region corresponding to reflector 20 is filled with dots. Advantageous effects, etc., of reflector 20 will be described with reference to FIG. 5 and FIG. 6.

LED chips 12 are one example of the light emitting elements, and are blue light LED chips that emit blue light. Examples of LED chips 12 include gallium nitride LED chips made from, for example, an InGaN material, and whose central wavelength (peak wavelength in the spectrum of emitted light) is between from 430 nm to 480 nm LED chips 12 are disposed on major surface 11a of substrate 11. In this embodiment, two light emitting element groups each including six LED chips 12 connected in series are disposed on major surface 11a of substrate 11. These two light emitting element groups are connected in parallel and emit light upon power being supplied between electrodes 16a and 16b.

LED chips 12 connected in series are connected together in a chip-to-chip configuration by bonding wires 17. Bonding wires 17 are wires connected to LED chips 12 for supplying power to LED chips 12. Examples of the metal material used for bonding wires 17, lines 16, and electrodes 16a and 16b include gold (Au), silver (Au), and copper (Cu).

Note that the number and electrical connection of LED chips 12 are not particular limited. For example, all LED chips 12 disposed on major surface 11a of substrate 11 may be connected in series.

Dam 15 is formed on major surface 11a of substrate 11 and holds back the material used to form sealant layer 13. Examples of the material used for dam 15 include electrically insulating thermosetting resin and thermoplastic resin.

More specifically, dam 15 can be made from silicon resin, phenol resin, epoxy resin, bismaleimide triazine resin, and polyphthalamide (PPA).

Dam 15 is preferably reflective so as to increase the light extraction efficiency of light emitting device 10. As such, in Embodiment 1, dam 15 is made from a white resin. Note that dam 15 may include $TiO_2$, $Al_2O_3$, $ZrO_2$, and/or MgO particles to improve the reflective property of dam 15.

Dam 15 according to this embodiment is, in a plan view (i.e., in a view looking at major surface 11a of substrate 11 of light emitting device 10; the same applies hereinafter), formed in a circular ring shape that surrounds LED chips 12. Sealant layer 13 is formed in the region surrounded by dam 15. Note that dam 15 may have, for example, a rectangular ring-shaped outline.

Sealant layer 13 is one example of the first sealant layer, and in this embodiment, seals LED chips 12 and reflector 20. Sealant layer 13 also seals bonding wires 17 and part of lines 16.

In this embodiment, sealant layer 13 contains a wavelength converter that converts the wavelength of light emitted by LED chips 12. More specifically, as illustrated in FIG. 4B, sealant layer 13 is configured of light transmissive resin 13b containing yellow phosphor particles 14a as the wavelength converter. For example, a methyl silicon resin is used for light transmissive resin 13b, but other examples of light transmissive resin 13b include epoxy resin and urea resin.

Yellow phosphor particles 14a are one example of the wavelength converter, and emit yellow fluorescent light when excited by the light from LED chips 12. Examples of yellow phosphor particles 14a include yttrium aluminum garnet (YAG) phosphor particles.

The wavelength of some of the blue light emitted by LED chips 12 is converted into yellow light by yellow phosphor particles 14a contained in sealant layer 13. The blue light not absorbed by yellow phosphor particles 14a and the yellow light resulting from the wavelength conversion by yellow phosphor particles 14a diffuse and mix together in sealant layer 13. As a result, sealant layer 13 emits white light.

Note that in this embodiment, dam 15 also has an advantageous effect of reducing the amount of light that leaks out of light emitting device 10 from the lateral sides of LED chips 12. Since LED chips 12 mainly emit light upward (toward sealant layer 13), it is not uncommon for light of an undesired color to be emitted from the lateral sides of LED chips 12, due to an increase in yellow light components from yellow phosphor particles 14a. Dam 15 serves as a wall that blocks such light, reducing the amount of such light leaking out from light emitting device 10.

Moreover, the color of light emitted by light emitting device 10 is not particularly limited. For example, even when the color of light emitted by LED chips 12 is fixed to blue light, the color of light emitted by light emitting device 10 can be changed to a color other than white by changing the type or amount of the wavelength converter contained in sealant layer 13.

(Detailed Description of Reflector)

As described above, light emitting device 10 includes substrate 11 and LED chips 12 disposed on major surface 11a of substrate 11. Substrate 11 includes reflector 20 recessed in major surface 11a of substrate 11 and surrounding each of LED chips 12.

In this embodiment, reflector 20 provided in major surface 11a of substrate 11 reduces unevenness in the luminance and/or color of light from light emitting device 10. This will be explained with reference to FIG. 5 and FIG. 6.

Figure 5:
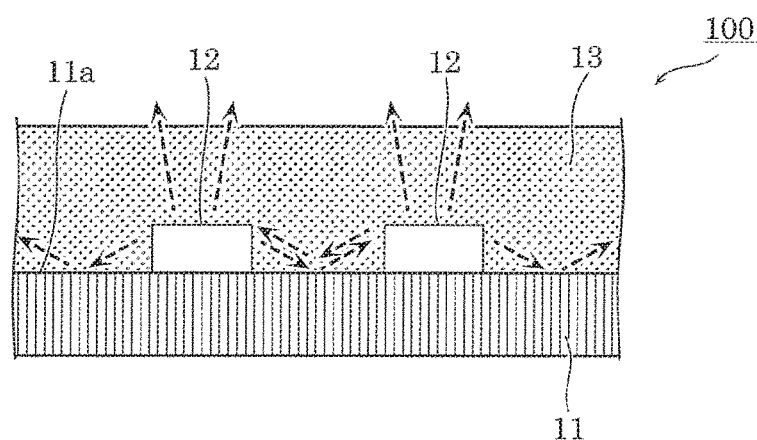
FIG. 5 is an enlarged cross sectional view illustrating the structure of a light emitting device according to a comparative example.
Figure 6:
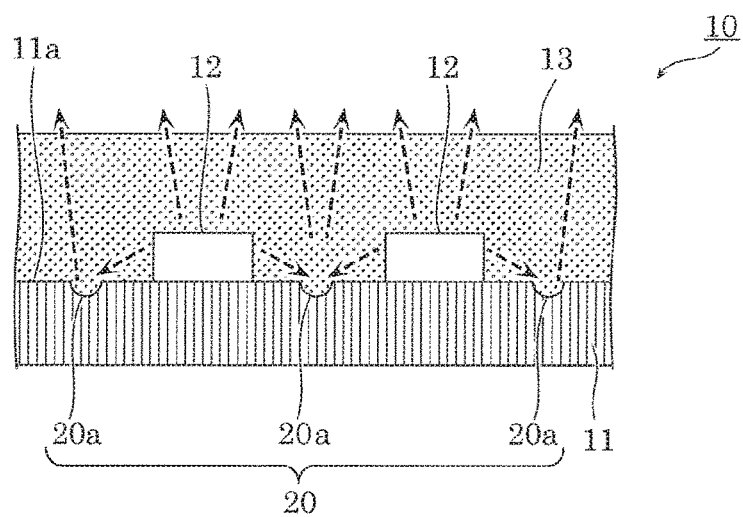
FIG. 6 is an enlarged cross sectional view illustrating the structure of the light emitting device according to Embodiment 1.

FIG. 5 is an enlarged cross sectional view illustrating the structure of light emitting device 100 according to a comparative example, and FIG. 6 is an enlarged cross sectional view illustrating the structure of light emitting device 10 according to Embodiment 1. Note that in FIG. 5 and FIG. 6, the dashed arrows schematically indicate paths of light emitted by LED chips 12, and indication of reflection or refraction at the interface between sealant layer 13 and the atmosphere (in FIG. 5 and FIG. 6, the top surface of sealant layer 13) is omitted from the illustrations.

For example, FIG. 5 illustrates a case in which grooves 20a included in reflector 20 are not formed next to the lateral sides of LED chips 12. In this case, light from LED chips 12 that is incident on major surface 11a at a relatively high angle of incidence is, for example, as illustrated in FIG. 5, blocked by an adjacent LED chip 12 after reflecting off major surface 11a. In other words, light emitted from LED chips 12 toward major surface 11a cannot be efficiently extracted.

As a result, when light emitting device 100 is emitting light, light directly above LED chips 12 is high in luminance and blue components, but light directly above regions between adjacent LED chips 12 is low in luminance and blue components. Stated differently, with light emitting device 100 according to the comparative example, the color and luminance of light can appear uneven due to the light sources (LED chips 12) being disposed in discrete points on substrate 11.

Conversely, in light emitting device 10 according to this embodiment, grooves 20a included in reflector 20 are formed next to the lateral sides of LED chips 12. As such, for example, as illustrated in FIG. 6, light emitted from LED chips 12 toward major surface 11a that is incident on grooves 20a is reflected by the inner surfaces of grooves 20a, and travels in the general light emission direction of light emitting device 10 (upward in FIG. 6). With this, light emitted from LED chips 12 toward major surface 11a can be efficiently extracted out of light emitting device 10.

More specifically, blue light components are increased compared to when no grooves 20a are provided in regions to the lateral sides of LED chips 12 in a plan view. Further, reflector 20, which achieves this advantageous effect, surrounds each of LED chips 12 (for example, see FIG. 3).

In other words, compared to light emitting device 100 according to the comparative example, in light emitting device 10 according to this embodiment, more light (in this embodiment, white light) is extracted in the regions to the lateral sides of LED chips 12. As a result, unevenness in at least one of the luminance and color of light from light emitting device 10 is reduced.

Note that in FIG. 6, grooves 20a have a semicircular cross section, but grooves 20a are not required to have a semicircular cross section. For example, grooves 20a can have a cross section defined by a portion of an ellipse, or have a V-shaped cross section, as will be described later in a variation.

Here, it is possible to reduce unevenness in luminance and/or color by, for example, including particles, such as $Al_2O_3$ particles, for diffusing light (i.e., light diffusers) in sealant layer 13. However, since the light diffusers may also function to block light, when sealant layer 13 contains light diffusers, the total luminous flux of light emitting device 10 is less than when sealant layer 13 does not contain light diffusers. In light emitting device 10 according to this embodiment, there is no decrease in the total luminous flux due to the addition of light diffusers to sealant layer 13 since unevenness in luminance and/or color is reduced by changing the structure of substrate 11.

More specifically, in this embodiment, reflector 20 includes grooves 20a recessed in major surface 11a, and at least one groove 20a extends across a region between two adjacent LED chips 12.

With this configuration, at least one groove 20a can serve to increase the amount of light in a region between at least two LED chips 12 disposed on either side of groove 20a. In other words, with a relatively simple structure, a decrease in unevenness in luminance and/or color can be reduced with light emitting device 10 including a plurality of LED chips 12.

Moreover, in this embodiment, part of reflector 20 (in this embodiment, groove 20a) is located in a central location between two adjacent LED chips 12. This makes it possible to increase the amount of light in the central region between these two LED chips 12. This in turn makes it possible to increase the homogeneity of the luminance and/or color of the light from light emitting device 10.

Next, examples of the sizes of, for example, LED chips 12 according to this embodiment will be given. LED chips 12 have a height of from approximately 100 μm to hundreds of μm, and adjacent LED chips 12 are spaced from each other at a distance of from hundreds of μm to several mm. Moreover, the portion of reflector 20 that is recessed (in this embodiment, grooves 20a) has a depth of from several μm to tens of μm and a width (for example, lateral width of the opening in FIG. 6) of from approximately several μm to several mm. Stated differently, in this embodiment, depressions having a width in the order of from several μm to the order of several mm are disposed between adjacent LED chips 12, and unevenness in luminance and/or color is reduced by light reflecting off the inner surfaces of the depressions.

Note that the techniques used to form such a reflector 20 are not particularly limited. For example, reflector 20 may be formed in substrate 11 by laser cutting substrate 11. Moreover, for example, when substrate 11 is a resin substrate or a ceramic substrate, reflector 20 may be formed along with substrate 11 in the mold.

Moreover, when substrate 11 is a white ceramic substrate having, for example, alumina as a base material, this is advantageous from the point of view of effectiveness of light extraction from light emitting device 10 since major surface 11a and the inner surface of grooves 20a are highly reflective.

Moreover, in this embodiment, as illustrated in FIG. 3, major surface 11a of substrate 11 is divided into a plurality of regions defined by grooves 20a formed in a lattice pattern, and one LED chip 12 among the plurality of LED chips 12 is disposed in each of the plurality of regions.

This configuration makes it possible to, for example, efficiently surround LED chips 12 disposed in a matrix with relatively few straight line grooves 20a. In other words, reflector 20 for reducing unevenness in luminance and/or color can be formed relatively easily. Note that reflector 20 illustrated in FIG. 3 can be said to include five straight line columns of grooves 20a and five straight line rows of grooves 20a.

Moreover, in this embodiment, reflector 20 surrounds each and every LED chip 12 disposed on major surface 11a of substrate 11. In other words, light emitting device 10 includes N (N being an integer of 2 or more) LED chips 12 disposed on major surface 11a of substrate 11, and reflector 20 surrounding each of the N (N being an integer of 2 or more) LED chips 12.

In this way, light emitting device 10 according to this Embodiment is configured such that light from all LED chips 12 serving as the light sources of light emitting device 10 can be efficiently extracted. As such, for example, it is possible to maximize the luminous flux of light from light emitting device 10 having a desired color (in this embodiment, white) with a simple structure.

Moreover, in this embodiment, light emitting device 10 includes sealant layer 13 that seals LED chips 12 and reflector 20. With this, LED chips 12 and reflector 20 are protected by sealant layer 13. This, for example, inhibits the deterioration of LED chips 12 caused by moisture and gas external to light emitting device 10. This also, for example, inhibits a decrease in reflectivity caused by foreign matter entering grooves 20a included in reflector 20 or by the yellowing of the inner surface of grooves 20a.

Note that the configuration of light emitting device 10 for reducing unevenness in luminance and/or color may be a different configuration than the configuration described above. Next, various variations pertaining to, for example, reflector 20 will be described focusing on the differences from the above embodiment.

Variation 1

Figure 7:
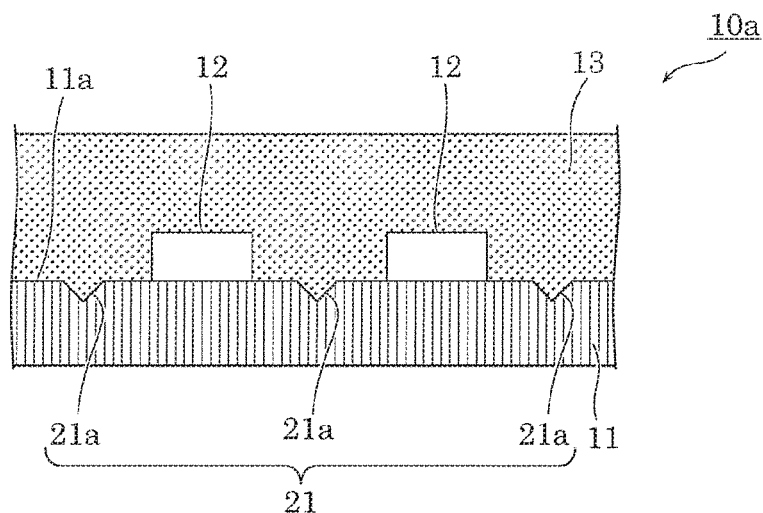
FIG. 7 is an enlarged cross sectional view illustrating the structure of the light emitting device according to Variation 1 of Embodiment 1.

FIG. 7 is an enlarged cross sectional view illustrating the structure of light emitting device 10a according to Variation 1 of Embodiment 1.

Light emitting device 10a illustrated in FIG. 7 includes substrate 11 and LED chips 12 disposed on major surface 11a of substrate 11, and substrate 11 includes reflector 21. Reflector 21 is recessed in major surface 11a of substrate 11. More specifically, reflector 21 includes a plurality of grooves 21a, and similar to reflector 20 according to Embodiment 1 illustrated in FIG. 3, for example, surrounds each of LED chips 12.

In other words, light emitting device 10a according to this variation shares the same above configuration with light emitting device 10 according to Embodiment 1.

However, the cross sectional shape of grooves 21a included in reflector 21 according to this variation is different from that of grooves 20a included in reflector 20 according to Embodiment 1. More specifically, while grooves 20a according to Embodiment 1 have a semicircular cross sectional shape (see, for example, FIG. 6), grooves 21a have a V-shaped cross section.

With this configuration as well, part of the inner surface of grooves 21a is inclined relative to major surface 11a. Consequently, light that could not be reflected in the general light emission direction of light emitting device 10a (upward in FIG. 7) when grooves 21a are not provided can be reflected in the general light emission direction by grooves 21a. With this, light emitted from LED chips 12 toward major surface 11a can be efficiently extracted out of light emitting device 10a.

Note that in addition to a V-shaped cross section, a variety of cross sectional shapes are applicable to grooves 21a; for example, grooves 21 may have a U-shaped, W-shaped, or right triangular cross section.

Variation 2

Figure 8:
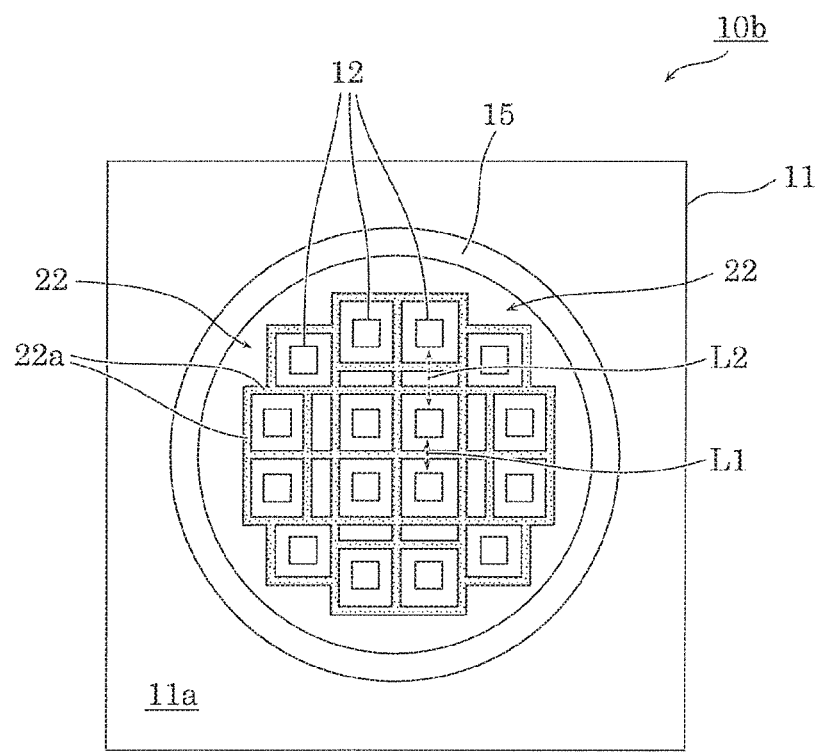
FIG. 8 is a plan view of the light emitting device according to Variation 2 of Embodiment 1.

FIG. 8 is a plan view of light emitting device 10b according to Variation 2 of Embodiment 1. Note that illustration of, for example, sealant layer 13 as well as bonding wires 17 and lines 16, which are connected to LED chips 12, is omitted from FIG. 8. Moreover, to make it easier to differentiate between reflector 22 and other components on substrate 11, the region corresponding to reflector 22 is filled with dots. These also apply to FIG. 9 and FIG. 10 to be described later.

Light emitting device 10b illustrated in FIG. 8 includes substrate 11 and LED chips 12 disposed on major surface 11a of substrate 11, and substrate 11 includes reflector 22. Reflector 22 is recessed in major surface 11a of substrate 11 and surrounds each of LED chips 12. More specifically, reflector 22 includes a plurality of grooves 22a arranged in a lattice pattern. Note that grooves 22a included in reflector 22 have, in a cross section taken perpendicular to the lengthwise direction, a semicircular or V-shaped cross section.

In other words, light emitting device 10b according to this variation shares the same above configuration with light emitting device 10 according to Embodiment 1.

However, with light emitting device 10b according to this variation, the number of grooves 22a disposed between adjacent LED chips 12 is not the same for all adjacent LED chips 12.

More specifically, the number of grooves 22a disposed between two adjacent LED chips 12 spaced apart by a first distance is less than the number of grooves 22a disposed between two adjacent LED chips 12 spaced apart by a second distance greater than the first distance.

Referring to FIG. 8, one groove 22a is disposed across the region between two adjacent LED chips 12 spaced apart by first distance L1. Two grooves 22a are disposed across the region between two adjacent LED chips 12 spaced apart by second distance L2 (L2>L1). Stated differently, the greater the distance between two adjacent LED chips 12 is, the greater the number of grooves 22a are disposed therebetween.

In other words, the farther two adjacent LED chips 12 are spaced apart, the larger the non-light-emitting region between the two LED chips 12 is and the more apparent the unevenness in the luminance and/or color of the light from light emitting device 10b is. In light of this, in this variation, reflector 22 is formed in substrate 11 such that a plurality of grooves 22a are disposed between two adjacent LED chips 12 disposed far apart.

With this, a relatively larger reflective region defined by reflector 22 (pseudo-light-emitting region) can be provided in a relatively large non-light-emitting region. This in turn makes it possible to increase the homogeneity of the luminance and/or color of the light from light emitting device 10b. In other words, unevenness in luminance and/or color is reduced in light emitting device 10b.

Note that in this embodiment, a maximum of two grooves 22a are disposed between two adjacent LED chips 12, but three or more grooves 22a may be disposed across the region between two adjacent LED chips 12.

Variation 3

Figure 9:
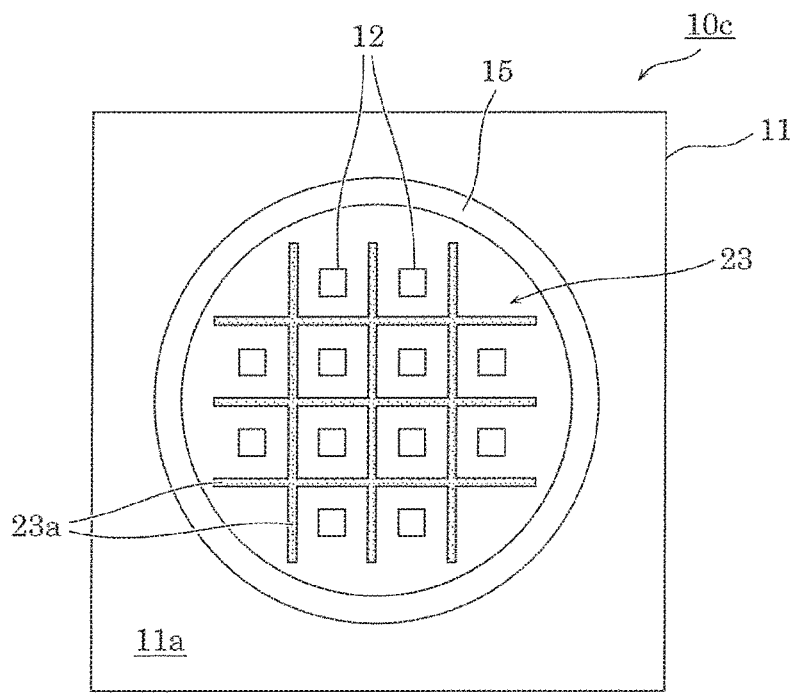
FIG. 9 is a plan view of the light emitting device according to Variation 3 of Embodiment 1.

FIG. 9 is a plan view of light emitting device 10c according to Variation 3 of Embodiment 1. Light emitting device 10c illustrated in FIG. 9 includes substrate 11 and LED chips 12 disposed on major surface 11a of substrate 11, and substrate 11 includes reflector 23. Reflector 23 is recessed in major surface 11a of substrate 11 and surrounds each of LED chips 12. More specifically, reflector 23 includes a plurality of grooves 23a arranged in a lattice pattern.

In other words, light emitting device 10c according to this variation shares the same above configuration with light emitting device 10 according to Embodiment 1.

However, with light emitting device 10c according to this variation, reflector 23 surrounds a plurality (in this variation, four) of the twelve LED chips 12 disposed on major surface 11a of substrate 11. In other words, the remaining eight LED chips 12 are only surrounded by reflector 23 on three sides due to reflector 23 not being formed around the outer perimeter of the region in which the twelve LED chips 12 are disposed.

Even with this configuration, each of the four central LED chips 12 are surrounded by reflector 23 on all sides, and light emitted from these four LED chips 12 toward major surface 11a of substrate 11 can be efficiently extracted. Moreover, in a plan view, excluding the outer regions (regions nearest dam 15), reflector 23 (grooves 23a) is disposed around each of the eight LED chips 12 that surround the four central LED chips 12. As such, regarding each of these eight LED chips 12, since light is reflected by reflector 23 except in the outer regions of the eight LED chips 12, there is an advantageous effect that light extraction efficiency is increased. This in turn makes it possible to increase the homogeneity of the luminance and/or color of the light from light emitting device 10c. In other words, unevenness in luminance and/or color is reduced in light emitting device 10c.

In this way, even when reflector 23 surrounds two or more but not all of LED chips 12 disposed on major surface 11a of substrate 11, unevenness in luminance and/or color can be reduced.

Note that the region outside of the region in which LED chips 12 are disposed on major surface 11a of substrate 11 is a region in which no light sources (LED chips 12) are disposed. Accordingly, even when reflector 23 is not provided in the outer perimeter of the region in which LED chips 12 are disposed, unevenness in luminance and/or color is not easily noticeable. Stated differently, when reflector 23 surrounds two or more but not all of LED chips 12, the surrounded LED chips 12 are preferably disposed in the central area of the region in which all of LED chips 12 are disposed.

Variation 4

Figure 10:
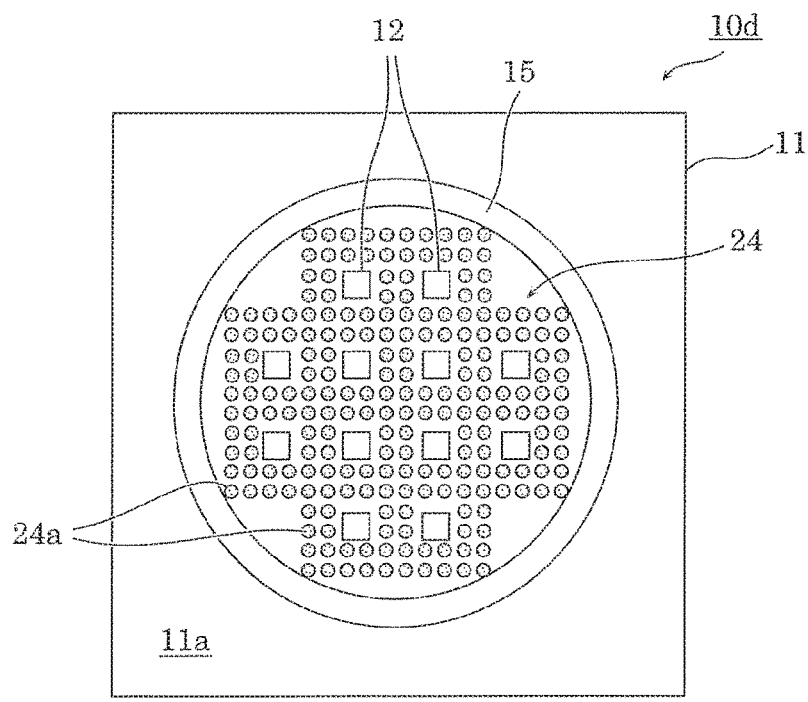
FIG. 10 is a plan view of the light emitting device according to Variation 4 of Embodiment 1.

FIG. 10 is a plan view of light emitting device 10d according to Variation 4 of Embodiment 1. Light emitting device 10d illustrated in FIG. 10 includes substrate 11 and LED chips 12 disposed on major surface 11a of substrate 11, and substrate 11 includes reflector 24. Reflector 24 is recessed in major surface 11a of substrate 11 and surrounds each of LED chips 12.

In other words, light emitting device 10d according to this variation shares the same above configuration with light emitting device 10 according to Embodiment 1.

However, with light emitting device 10d according to this variation, reflector 24 includes a plurality of discrete depressions 24a surrounding each of LED chips 12. In other words, reflector 24 is configured of a plurality of minute pits (depressions 24a), and each of LED chips 12 is surrounded by depressions 24a.

With this, light from LED chips 12 traveling toward major surface 11a of substrate 11 is highly likely to be reflected by depressions 24a in the general light emission direction of light emitting device 10d (in FIG. 10, directly forward out of the paper surface). As a result, light from LED chips 12 is efficiently extracted.

Note that when reflector 24 is formed in substrate 11, depressions 24a are formed in a range excluding regions in which other components, such as lines 16 and LED chips 12, are disposed. In this case, since LED chips 12 are in surface contact with major surface 11a, heat from LED chips 12 can be efficiently radiated via substrate 11.

Moreover, depressions 24a have a depth of, for example, from approximately several μm to tens of μm, and the diameter of the openings on major surface 11a is in a range of from approximately several μm to several mm.

Moreover, in FIG. 10, depressions 24a are precisely aligned, but the layout of depressions 24a is not particularly limited. For example, depressions 24a may be disposed randomly in a range excluding regions in which other components, such as lines 16 and LED chips 12, are disposed.

Moreover, depressions 24a need not have a round opening on major surface 11a of substrate 11; depressions 24a may have a polygonal opening such as a triangular opening. Likewise, a variety of cross sectional shapes are applicable to depressions 24a, such as semicircular or V-shaped cross sectional shapes.

Variation 5

Figure 11A:
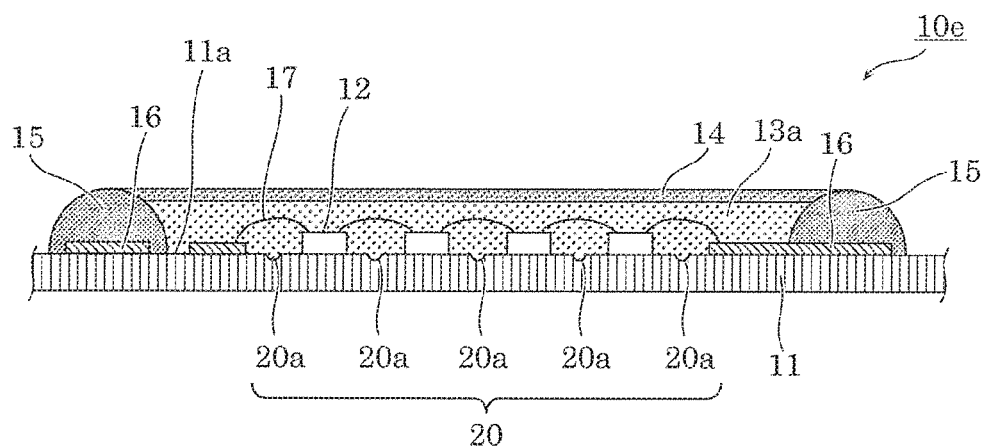
FIG. 11A is a diagrammatic cross sectional view of the light emitting device according to Variation 5 of Embodiment 1.
Figure 11B:
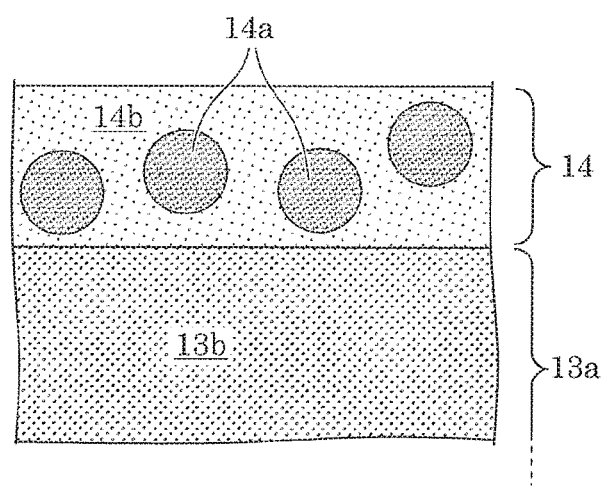
FIG. 11B schematically illustrates the configuration of the sealant layer and the wavelength converter layer according to Variation 5 of Embodiment 1.

FIG. 11A is a diagrammatic cross sectional view of light emitting device 10e according to Variation 5 of Embodiment 1, and FIG. 11B schematically illustrates configurations of sealant layer 13a and wavelength converter layer 14 according to Variation 5 of Embodiment 1. Note that the cross section illustrated in FIG. 11A is a cross section of light emitting device 10e taken at a location corresponding to line IV-IV in FIG. 3.

Light emitting device 10e illustrated in FIG. 11A includes substrate 11 and LED chips 12 disposed on major surface 11a of substrate 11, and substrate 11 includes reflector 20. Reflector 20 is recessed in major surface 11a of substrate 11 and surrounds each of LED chips 12 (for example, see FIG. 3 and FIG. 6).

Moreover, light emitting device 10e includes sealant layer 13a. Sealant layer 13a is one example of the first sealant layer, and in this variation, seals LED chips 12 and reflector 20.

In other words, light emitting device 10e according to this variation shares the same above configuration with light emitting device 10 according to Embodiment 1.

However, sealant layer 13a according to this variation differs from sealant layer 13 according to Embodiment 1 in that sealant layer 13a does not contain yellow phosphor particles 14a, as illustrated in FIG. 11B. In other words, sealant layer 13a is configured of light transmissive resin 13b that does not contain yellow phosphor particles 14a. Moreover, light emitting device 10e according to this embodiment includes wavelength converter layer 14 disposed above sealant layer 13a. Wavelength converter layer 14 is one example of the second sealant layer and contains a wavelength converter that converts the wavelength of light emitted by LED chips 12. More specifically, wavelength converter layer 14 is formed so as to have a uniform thickness by light transmissive resin 14b which contains yellow phosphor particles 14a serving as the wavelength converter.

In this way, light emitting device 10e according to this variation is similar to light emitting device 10 according to Embodiment 1 in that LED chips 12 are collectively sealed. However, with light emitting device 10e according to this variation, the function of converting the wavelength of light emitted by LED chips 12 is performed by an upper layer (wavelength converter layer 14) among two stacked layers.

With this, the length that light emitted by LED chips 12 transmits through the layer containing yellow phosphor particles 14a is constant. In other words, the length of the portion of the path of light emitted by LED chips 12 in which the light undergoes wavelength conversion is, in almost the entire light emission region (i.e., the region inside dam 15 in a plan view), within a predetermined range based on the thickness of wavelength converter layer 14.

More specifically, similar to Embodiment 1, when LED chips 12 are directly covered by sealant layer 13 containing yellow phosphor particles 14a (for example, see FIG. 6), between light traveling directly upward from LED chips 12 and light traveling upward after reflecting off reflector 20, there is a difference in the distance that the light undergoes wavelength conversion by yellow phosphor particles 14a. Even more specifically, light traveling directly upward from LED chips 12 undergoes wavelength conversion by yellow phosphor particles 14a over a short distance, and light traveling upward after reflecting off reflector 20 undergoes wavelength conversion by yellow phosphor particles 14a over a long distance. Due to this, there are times when there is a difference in the appearance of color between regions directly above LED chips 12 and regions between two LED chips 12.

In light of this, in this variation, light traveling direction upward from LED chips 12 and light traveling upward after reflecting off reflector 20 both undergo wavelength conversion by yellow phosphor particles 14a, in wavelength converter layer 14 only. In other words, among paths of light emitted by LED chips 12, the distance over which the light undergoes wavelength conversion is uniform in almost the entire light emission region. As a result, unevenness in color in light emitting device 10e is further reduced.

In other words, in this variation, reflector 20, which surrounds LED chips 12, reduces unevenness in luminance and/or color. Additionally, among two layers that seal LED chips 12, by providing mainly the upper layer (wavelength converter layer 14) with the function of wavelength conversion, unevenness in color can be further reduced.

Note that similar to Embodiment 1, the color of light emitted by light emitting device 10e is not particularly limited. For example, even when the color of light emitted by LED chips 12 is fixed to blue light, the color of light emitted by light emitting device 10e can be changed to a color other than white by changing the type or amount of the wavelength converter contained in wavelength converter layer 14.

Embodiment 2

Figure 12:
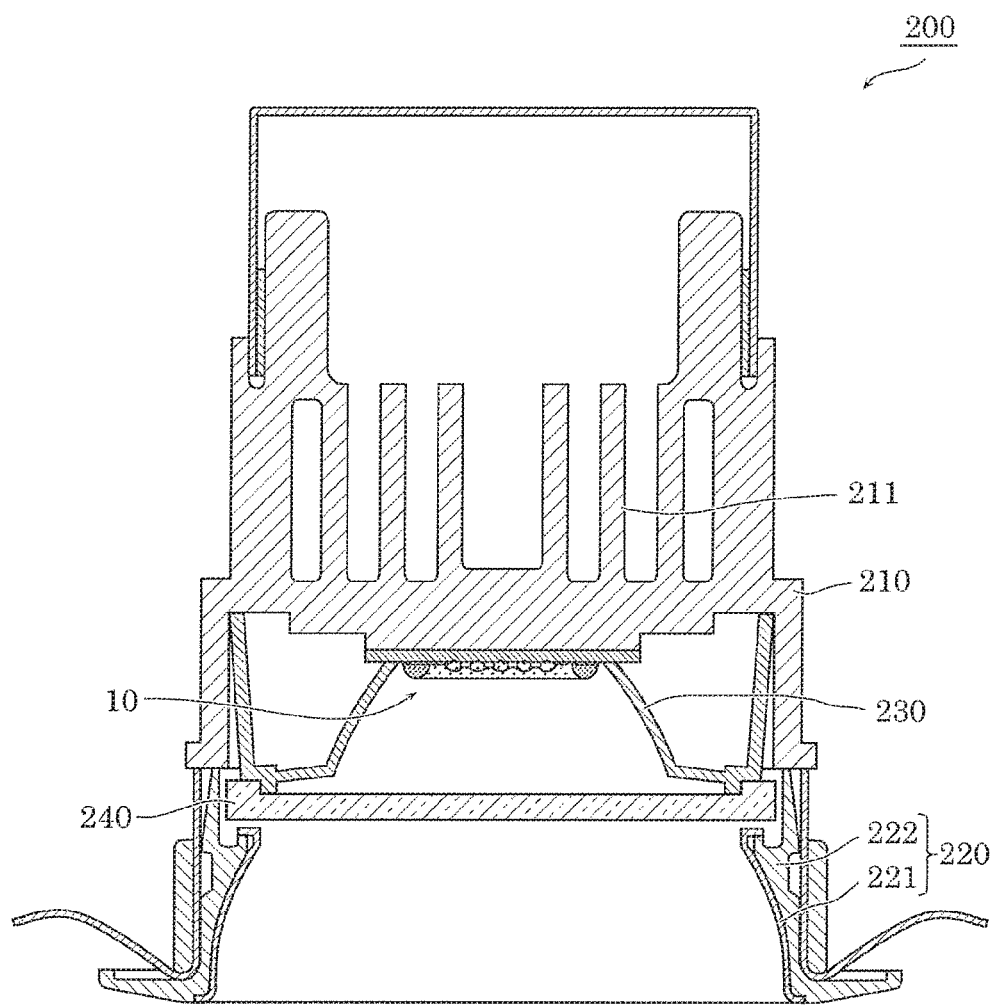
FIG. 12 is a cross sectional view of the lighting apparatus according to Embodiment 2.
Figure 13:
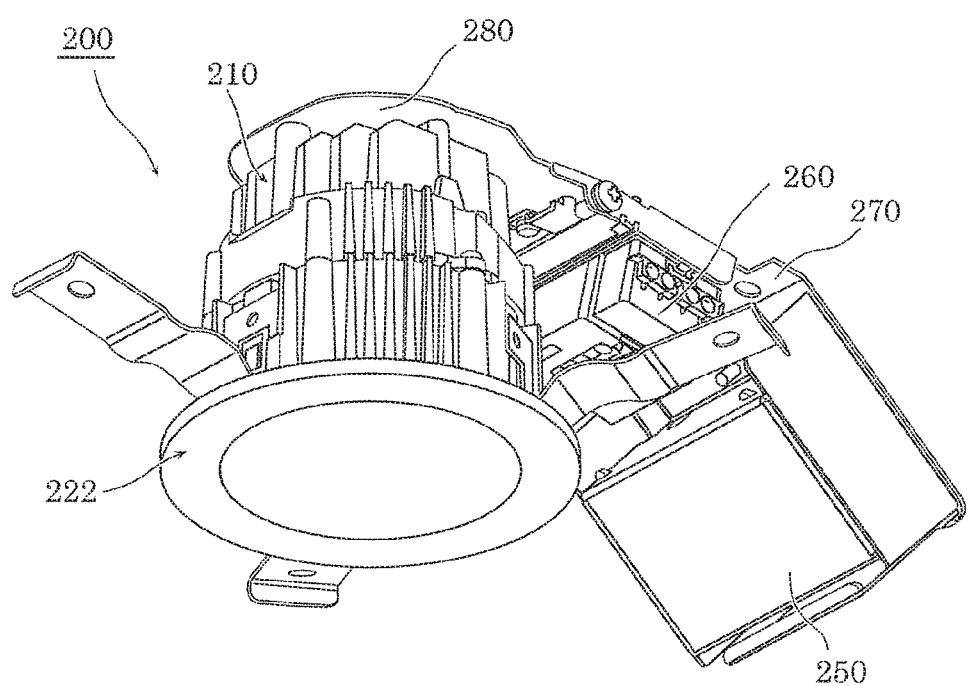
FIG. 13 is an external perspective view of the lighting apparatus according to Embodiment 2 and its surrounding components.

Next, lighting apparatus 200 according to Embodiment 2 will be described with reference to FIG. 12 and FIG. 13. FIG. 12 is a cross sectional view of lighting apparatus 200 according to Embodiment 2. FIG. 13 is an external perspective view of lighting apparatus 200 according to Embodiment 2 and its surrounding components.

As illustrated in FIG. 12 and FIG. 13, lighting apparatus 200 according to Embodiment 2 is a recessed lighting apparatus such as a down light that emits light downward (toward the floor or a wall, for example) as a result of being installed recessed in the ceiling of, for example, a house.

Lighting apparatus 200 includes light emitting device 10. Lighting apparatus 200 further includes: a bottomed cylindrical fixture body resulting from base 210 and frame body 220 being coupled together; reflective plate 230 arranged on the fixture body; and light transmissive panel 240 arranged on the fixture body.

Base 210 is an attachment pedestal to which light emitting device 10 attaches. Base 210 also functions as a heat sink for radiating heat generated by light emitting device 10. Base 210 is formed from metal so as to have a substantially circular cylindrical shape, and in Embodiment 2, is cast aluminum.

Base 210 includes, on the top portion (i.e., the ceiling side of base 210), a plurality of heat radiating fins 211 that protrude upward and are provided spaced evenly apart along one direction. With this, the heat generated by light emitting device 10 can be effectively dissipated.

Frame body 220 includes substantially circular cylindrical cone body 221 having an inner reflective surface, and frame main body 222 to which cone body 221 attaches. Cone body 221 is made from metal and, for example, can be produced by raising or stamping, for example, aluminum alloy. Frame main body 222 is made from a hard resin or metal. Frame body 220 is fixed by frame main body 222 being attached to base 210.

Reflective plate 230 is a torus shaped (funnel shaped) reflective component whose inner surface functions as a reflective surface. Reflective plate 230 can be made from metal such as aluminum. Note that reflective plate 230 may be made from a hard white resin instead of metal.

Light transmissive panel 240 is a light transmissive component having both light diffusion and light transmission properties. Light transmissive panel 240 is a flat plate disposed between reflective plate 230 and frame body 220, and is attached to reflective plate 230. Light transmissive panel 240 can be formed into a disc-like shape from a transparent resin such as acrylic or polycarbonate.

Note that lighting apparatus 200 need not include light transmissive panel 240. By omitting light transmissive panel 240, it is possible to increase the luminous flux of light emitted from lighting apparatus 200.

Moreover, as illustrated in FIG. 13, illumination apparatus 250 and terminal base 260 are connected to lighting apparatus 200. Illumination apparatus 250 supplies power for illuminating light emitting device 10, and terminal base 260 relays AC power from a utility power source to illumination apparatus 250.

Illumination apparatus 250 and terminal base 260 are fixed to attachment plate 270 provided as a separate component from the fixture body. Attachment plate 270 is formed by bending a rectangular metal plate. Illumination apparatus 250 is fixed to the bottom surface at one lengthwise end of attachment plate 270, and terminal base 260 is fixed to the bottom surface of the other lengthwise end. Attachment plate 270 and ceiling plate 280, which is fixed to the top portion of base 210 of the fixture body, are coupled together.

Since lighting apparatus 200 includes light emitting device 10, lighting apparatus 200 can emit illumination light having a low degree of luminous and/or color unevenness.

Note that lighting apparatus 200 may include one of the light emitting device according to any of the above Variations 1 through 5 (light emitting devices 10a through 10e) instead of light emitting device 10.

Moreover, in this embodiment, the lighting apparatus is exemplified as a down light, but the present teachings may be realized as a different type of lighting apparatus, such as a spot light.

Other Embodiments

Hereinbefore, light emitting device 10 and 10a through 10e according to Embodiment 1 and variations thereof, as well as lighting apparatus 200 according to Embodiment 2 have been described, but the present disclosure is not limited to, for example, Embodiment 1.

For example, in Embodiment 1 light emitting device 10 is described as having a COB structure, but a light emitting device including light emitting elements having a surface mount device (SMD) structure is also applicable to the present disclosure. An SMD light emitting element includes, for example, a resin container that opens upward, an LED chip mounted on the bottom surface of the container, and a sealant (phosphor-containing resin) that seals the LED chip. When a highly light transmissive container is used in such an SMD light emitting element, light emitted by each SMD light emitting element includes light emitted toward major surface 11a of substrate 11. As such, the difference between luminance directly above the SMD light emitting elements and the luminance directly above the region between two adjacent SMD light emitting elements is reduced as a result of substrate 11 including reflector 20 that surrounds each of the plurality of SMD light emitting elements. In other words, even when SMD light emitting elements are used as the light emitting elements disposed on major surface 11a of substrate 11, it is possible to realize the advantageous effect of a reduction by reflector 20 in luminance unevenness produced.

Moreover, the SMD light emitting element may include the reflector. In other words, when a plurality of LED chips are disposed on the substrate defining the bottom surface of the container, the SMD light emitting element may include a reflector recessed in the substrate (bottom surface of the container) and surrounding each of LED chips. With this, unevenness in luminance and/or color is reduced in one SMD light emitting element. In other words, the light emitting device according to the present disclosure may be realized as an SMD light emitting element.

Moreover, in Embodiment 1, light emitting device 10 is exemplified as emitting white light as a result of the combination of LED chips 12, which emit blue light, and yellow phosphor particles 14a, but light emitting device 10 is not limited to a configuration for emitting white light.

For example, a combination of a phosphor-containing resin containing red phosphors and green phosphors and LED chips 12 is acceptable. Alternatively, a combination of ultraviolet LED chips that emit ultraviolet light whose wavelength is shorter than that of the light emitted by LED chips 12 and blue, green and red phosphors that emit blue, red, and green light, respectively, by excitation mainly by the ultraviolet light is acceptable.

Moreover, in Embodiment 1, LED chips 12 mounted on substrate 11 are exemplified as being connected to one another by bonding wires 17 in a chip-to-chip configuration. However, LED chips 12 may be connected to lines (metal film) 16 provided on substrate 11 by bonding wires 17, and electrically connected to other LED chips via lines 16.

Moreover, in Embodiment 1 LED chips 12 are exemplified as being completely surrounded by reflector 20 (grooves 20a), but LED chips 12 need not be completely surrounded by reflector 20 (grooves 20a). For example, LED chips 12 may be disposed in a region inside a C-shaped groove formed in major surface 11a of substrate 11. Moreover, for example, four grooves may be provided surrounding the four sides of one LED chip 12, and two adjacent grooves among the four grooves need not be connected.

In any of these cases, there is an interruption in the groove in a portion of the region to the lateral sides of LED chips 12, but so long as this interruption is of a magnitude that essentially does not affect luminance and/or color unevenness, the groove may include an interruption.

Moreover, line 16 may be formed such that a portion thereof passes through the interruption in a groove in major surface 11a of substrate 11.

Moreover, grooves 20a included in reflector 20 need not be formed in straight lines in a plan view. For example, the reflector including a plurality of grooves may be formed such that, in a plan view, curved grooves surround each of LED chips 12 disposed on major surface 11a of substrate 11.

Moreover, in Embodiment 1, the light emitting elements included in light emitting device 10 are exemplified as LED chips 12. However, each of the light emitting elements may be a semiconductor light emitting element such as a semiconductor laser, or some other solid-state light emitting element such as an organic electroluminescent (EL) element or an inorganic EL element.

Moreover, in light emitting device 10, two or more types of light emitting elements that emit light of different colors may be used. For example, light emitting device 10 may include LED chips that emit red light in addition to LED chips 12 that emit blue light in order to increase the yellowness of the light.

Moreover, in Embodiment 1, etc., examples of the main materials used for each of sealant layers 13 and 13a and wavelength converter layer 14 were given, but each layer may include other materials so long as the functions of each of the layers as described above are still achievable.

Note that these additional comments regarding Embodiment 1 are also applicable to Variations 1 through 5 of Embodiment 1 and light emitting device, etc., according to Embodiment.

Additionally, embodiments arrived at by those skilled in the art making modifications to the above embodiments, as well as embodiments arrived at by combining various elements and functions described in the above embodiments without materially departing from the novel teachings and advantages of the present teachings, are intended to be included within the scope of the present teachings.

What is claimed is:

1. A light emitting device, comprising:
a reflector;
a substrate;
a plurality of light emitting elements disposed on a major surface of the substrate; and
a first sealant layer sealing the plurality of light emitting elements and the reflector,
wherein the substrate includes the reflector recessed in the major surface and surrounding at least a portion of the plurality of light emitting elements.

2. The light emitting device according to claim 1, wherein the reflector includes a plurality of grooves recessed in the major surface, and
at least one groove among the plurality of grooves extends across a region between two adjacent light emitting elements among the plurality of light emitting elements.

3. The light emitting device according to claim 2, wherein the plurality of grooves is arranged in a lattice pattern defining a plurality of regions on the major surface of the substrate, and
a single light emitting element among the plurality of light emitting elements is disposed in each of the plurality of regions.

4. The light emitting device according to claim 2, wherein a number of the plurality of grooves between pairs of adjacent ones of the portion of the plurality of light emitting elements is different.

5. The light emitting device according to claim 4, wherein the plurality of light emitting elements comprises a first pair of adjacent light emitting elements spaced apart by a first distance and a second pair of adjacent light emitting elements spaced apart by a second distance greater than the first distance, and
a total number of the plurality of grooves disposed between the first pair of adjacent light emitting elements is less than a total number of the plurality of grooves disposed between the second pair of adjacent light emitting elements.

6. A light emitting device, comprising:
a substrate; and a plurality of light emitting elements disposed on a major surface of the substrate,
wherein the substrate includes a reflector recessed in the major surface and surrounding at least a portion of the plurality of light emitting elements,
wherein the reflector includes a plurality of grooves recessed in the major surface,
wherein at least one groove among the plurality of grooves extends across a region between two adjacent light emitting elements among the plurality of light emitting elements, and
wherein each of the plurality of grooves has a semicircular cross-section.

7. The light emitting device according to claim 2, wherein each of the plurality of grooves has a v-shaped cross-section.

8. The light emitting device according to claim 1, wherein the reflector includes a plurality of discrete depressions surrounding the portion of the plurality of light emitting elements.

9. The light emitting device according to claim 8, wherein the plurality of discrete depressions is disposed randomly on the major surface of the substrate.

10. The light emitting device according to claim 1, wherein
the reflector surrounds each and every light emitting element disposed on the major surface of the substrate, including each of the plurality of light emitting elements.

11. A light emitting device, comprising:
a reflector;
a dam;
a substrate; and
a plurality of light emitting elements disposed on a major surface of the substrate,
wherein the substrate includes the reflector recessed in the major surface and surrounding at least a portion of the plurality of light emitting elements,
wherein the reflector surrounds each and every light emitting element disposed on the major surface of the substrate, including each of the plurality of light emitting elements, and
wherein the dam is disposed on the major surface of the substrate which surrounds the plurality of light emitting elements and the reflector.

12. The light emitting device according to claim 1, wherein
the reflector is not formed around a periphery of the plurality of light emitting elements.

13. The light emitting device according to claim 12, wherein
the reflector is formed on three sides of a second portion of the plurality of light emitting elements.

14. The light emitting device according to claim 1, wherein
the first sealant layer contains a wavelength converter that converts a wavelength of light emitted by the plurality of light emitting elements.

15. The light emitting device according to claim 14, wherein
the sealant layer includes a plurality of phosphor particles as the wavelength converter.

16. The light emitting device according to claim 1, further comprising:
a second sealant layer disposed above the first sealant layer,
wherein the second sealant layer contains a wavelength converter that converts a wavelength of light emitted by the plurality of light emitting elements.

17. The light emitting device according to claim 1, wherein
the reflector is formed next to each lateral side of the portion of the plurality of light emitting elements.

18. The light emitting device according to claim 17, wherein
the reflector is located in a central location between two adjacent ones of the portion of the plurality of light emitting elements.

19. A lighting apparatus comprising the light emitting device according to claim 1.

* * * * *